United States Patent
Chiu et al.

(10) Patent No.: US 6,955,177 B1
(45) Date of Patent: Oct. 18, 2005

(54) METHODS FOR POST POLYSILICON ETCH PHOTORESIST AND POLYMER REMOVAL WITH MINIMAL GATE OXIDE LOSS

(75) Inventors: Eddie Chiu, Pleasanton, CA (US); Cindy Wailam Chen, San Jose, CA (US); Yuh-Jia Su, Cupertino, CA (US); Wesley Phillip Graff, Austin, TX (US)

(73) Assignee: Novellus Systems, Inc., San Jose, CA (US)

( * ) Notice: Subject to any disclaimer, the term of this patent is extended or adjusted under 35 U.S.C. 154(b) by 273 days.

(21) Appl. No.: 10/011,497

(22) Filed: Dec. 7, 2001

(51) Int. Cl.$^7$ .............................. B08B 7/00; B08B 7/04
(52) U.S. Cl. .......................... 134/1.2; 134/1.1; 134/26
(58) Field of Search .............................. 134/1, 1.1, 1.2, 134/1.3, 26, 902; 438/906

(56) References Cited

U.S. PATENT DOCUMENTS

| | | | | |
|---|---|---|---|---|
| 4,691,662 | A | * | 9/1987 | Roppel et al. .............. 118/50.1 |
| 5,279,669 | A | * | 1/1994 | Lee ...................... 118/723 MR |
| 5,292,370 | A | * | 3/1994 | Tsai et al. ............. 118/723 MP |
| 5,362,358 | A | * | 11/1994 | Yamagata et al. ...... 156/345.42 |
| 5,413,954 | A | * | 5/1995 | Aydil et al. .................... 117/97 |
| 5,534,231 | A | * | 7/1996 | Savas .......................... 216/67 |
| 5,780,359 | A | * | 7/1998 | Brown et al. ................ 438/659 |
| 5,849,639 | A | * | 12/1998 | Molloy et al. .............. 438/714 |
| 6,074,514 | A | * | 6/2000 | Bjorkman et al. ..... 156/345.35 |
| 6,077,787 | A | * | 6/2000 | Reinhard et al. ........... 438/697 |
| 6,352,049 | B1 | * | 3/2002 | Yin et al. ............. 118/723 MP |
| 6,371,134 | B2 | * | 4/2002 | Subramanian et al. ....... 134/1.2 |
| 6,635,578 | B1 | * | 10/2003 | Xu et al. ..................... 438/706 |

OTHER PUBLICATIONS

Grill, Cold Plasma in Material Fabrication, IEEE Press, pp. 99-101, 109-110, 160-166 and 230-232, 1994.*

Fujimura, et al., "Additive Nitrogen Effects on Oxygen Plasma Downstream Ashing", Japanese Journal of Applied Physics, Part 1 (Regular Paper & Short Notes), vol. 29, No. 10m pp. 2165-2170, Oct. 1990.

Fujimura, et al., "Resist stripping in an $O_2 + H_2 O$ plasma downstream", J. Vac. Sci. Technology, B 9 (2), Mar./Apr. 1991, p. 357-361.

Pavel, et al., "Combining Microwave Downstream and RF Plasma Technology for Etch and Clean Applications", Proceedings of the International Symposium (Electrochemical Society Proceedings, vol. 99-30).

* cited by examiner

Primary Examiner—Alexander Markoff
(74) Attorney, Agent, or Firm—Beyer Weaver & Thomas, LLP

(57) ABSTRACT

The present invention pertains to methods for cleaning semiconductor wafers, more specifically, for removing polymeric and other residues from a wafer using dry plasmas generated with microwave (MW), electromagnetic field (inductively-coupled plasma (ICP)), and radio frequency (RF) energy. First, a wafer is treated by applying a microwave-generated plasma or an inductively-coupled plasma. Second, a radio frequency generated plasma is applied. Each of the microwave-generated plasma and the inductively-coupled plasma is produced from a gas mixture, which includes an oxygen source gas, a fluorine source gas, and a hydrogen source gas. Using such plasmas provides more controllable etch rates than conventional plasmas via control of fluorine concentration in the plasma. Application of a radio frequency generated (preferably oxygen-based) plasma is used for additional photoresist and polymer removal. The use of this two-step approach provides superior wafer cleaning compared to conventional wet and dry clean methods.

45 Claims, 4 Drawing Sheets

METHODS FOR POST POLYSILICON ETCH PHOTORESIST AND POLYMER REMOVAL WITH MINIMAL GATE OXIDE LOSS

FIELD OF THE INVENTION

The present invention pertains to methods for cleaning or surface treatment of semiconductor wafers. More specifically, the invention pertains to methods for removing polymeric and other residues from a wafer using dry plasmas generated with microwave (MW), electromagnetic field (inductively-coupled plasma (ICP)), and radio frequency (RF) energy. The invention is applicable to Damascene and other integrated circuit fabrication processing.

BACKGROUND OF THE INVENTION

Photoresist strip and residue removal are critical in integrated circuit (IC) fabrication. During polysilicon etching in a typical integrated circuit fabrication process, undesirable etch residues and/or polymers such as hydrocarbon, oxide and/or silicon residues (e.g. $Si_xBr_xCl_xO_x$) may be formed and left on the surfaces and sidewalls of the resulting polysilicon structure. Such undesirable residues along with the remaining post-etch photoresist must be removed to prevent oxidation quality issues, adhesion problems, and/or diffusion contamination in subsequent integrated circuit fabrication steps.

Post-etch photoresist and polymer residue removal over polysilicon presents numerous challenges. Traditional wet chemical cleaning methods which use cleaning solutions such as dilute HF (50:1–1000:1 $HF:H_2O$), "hot Piranha" (90% $H_2SO_4$/10% $H_2O_2$), and other corrosive solvents are often ineffective at removing all undesirable polymer residues. Depending on the application, these wet cleaning methods can over etch exposed layers or under etch (clean or strip) any remaining photoresist and polymer residue. This can cause device reliability problems or lead to nonfunctional circuits. These traditional wet clean methods also have the disadvantage of requiring handling and exposure to corrosive, oxidizing, and strongly acidic media, thus requiring extensive abatement and environmental controls.

Plasmas based on fluorine and oxygen have been used for removing post etch photoresist and polymer residues, particularly organics. Fluorine radicals and ions in such plasmas react with the organic molecules to volatilize, rendering them more water soluble and weaking their bonding structure toward plasma removal via physical etch. Molecular oxygen can aggressively remove polymer layers.

Although dry plasma cleaning processes offer an alternative approach to wet chemistry cleaning techniques, oftentimes conventional dry plasma chemistries provide insufficient cleaning, require lengthy process times, and importantly exhibit poor selectivity to exposed layers. This selectivity problem is exemplified in the over stripping of gate oxide during removal of post-etch photoresist and polymer residues. Cleaning effectiveness and selectivity are often sacrificed in the name of throughput. For example, high temperature plasma methods often remove unwanted residues and upper layers on a device quickly, but are often hard to control and thus unacceptable amounts of oxide or other underlying layers are lost. This issue is becoming increasingly important with integrated circuit device structures becoming smaller and smaller.

Cleaning wafers with various types of plasmas and plasma power sources have been described. Recently Pavel ("Combining microwave downstream and RF plasma technology for etch and clean applications", Proceedings of the International Symposium, Electrochemical Society Proceedings Vol. 99–30) described the use of a two-step process for etch and clean applications. She reported that treatment of a wafer with a RF generated oxygen-based plasma followed by application of a microwave (MW) generated plasma at high temperature was effective at cleaning some post etch and post high dose implant strip layer with enhanced etch rates. This method has the disadvantage of oxidizing polymer residues due to the exposure to high temperatures (200–300° C.), making them harder to remove in subsequent steps. Many low-k materials are also sensitive to high temperature process steps and so cannot be used with such high temperature plasma processing.

What is needed therefore are improved methods of cleaning or treating the surface of semiconductor wafers during integrated circuit fabrication. Preferably low temperature methods that not only effectively remove unwanted layers from integrated circuit devices, but also show selectivity by not over stripping desired layers from the devices.

SUMMARY OF THE INVENTION

The present invention pertains to methods for cleaning or surface treatment of semiconductor wafers. More specifically, the invention pertains to methods for removing polymeric and other residues from a wafer using dry plasmas generated with microwave (MW), electromagnetic field (inductively-coupled plasma (ICP)), and radio frequency (RF) energy. First, a wafer is treated by applying a microwave-generated plasma or an inductively-coupled plasma. Second, a radio frequency generated plasma is applied. Process conditions for each plasma application dictate the removal rate and selectivity of the methods. Each of the microwave-generated plasma and the inductively-coupled plasma is produced from a gas mixture, which includes an oxygen source gas, a fluorine source gas, and a hydrogen source gas. Using such plasmas provides more controllable etch rates than conventional plasmas via control of fluorine concentration in the plasma. Application of a radio frequency generated (preferably oxygen-based) plasma is used for additional photoresist and polymer removal. The use of this two-step approach provides superior wafer cleaning compared to conventional wet and dry clean methods.

One aspect of the invention is a method of cleaning a semiconductor wafer. Such methods may be characterized by the following sequence: (a) applying a microwave-generated plasma or an inductively-coupled plasma to the wafer; and then (b) applying a radio frequency generated plasma to the wafer. Preferably (a) and (b) are performed in a single process chamber. Preferably (a) is performed for between about 5 and 60 seconds, more preferably about 15 seconds. Preferably (b) is performed for between about 10 and 90 seconds, more preferably about 70 seconds. In some embodiments, a deionized water rinse may be applied to the wafer after (a) and (b).

In one embodiment (a) further includes applying an RF bias to the microwave-generated plasma or the inductively-coupled plasma. In some cleaning applications, the additional directionality afforded by the RF bias in conjunction with the microwave-generated plasma or the inductively-coupled plasma is desirable to remove particular polymers or residues from a wafer.

Most preferably, each of the microwave-generated plasma and the inductively-coupled plasma includes an oxygen source gas, a fluorine source gas, a hydrogen source gas, and optionally a nitrogen source gas. The oxygen source gas preferably includes at least one of $O_2$, $H_2O$, $O_3$, $CO_2$, CO, and $N_2O$. Preferably the fluorine source gas comprises at least one of $CF_4$, $NF_3$, $CHF_3$, $SF_6$, and $F_2$. Preferably the hydrogen source gas includes at least one of $H_2$, $H_2O$, $NH_3$, and $H_2O_2$. Preferably, the nitrogen source gas includes at least one of $N_2$, $N_2O$, and $NH_3$. In a particularly preferred embodiment, a gas mixture of $N_2$ and $H_2$ is used to as both the nitrogen source gas and the hydrogen source gas. The ratios of the source gases will dictate the desired outcome, as explained in the detailed description below.

By including a hydrogen source gas to the microwave-generated plasma or inductively-coupled plasma, it is believed that the atomic fluorine concentration is controlled due to in-situ reaction between hydrogen and fluorine species to produce HF vapor. By controlling the total fluorine concentration in the microwave-generated plasma or the inductively-coupled plasma, the base layer etch rates are readily controlled and a high selectivity is achieved towards faster polymer removal and minimization of base layer removal.

Preferably each of the microwave-generated plasma and inductively-coupled plasma is produced at a pressure of between about 300 and 200 mTorr, more preferably about 500 and 1000, and most preferably about 750 mTorr. Also preferably the microwave-generated plasma is produced with a power of between about 500 and 2000 Watts per wafer, more preferably about 1300 Watts per wafer, at for example a frequency of about 2.45 GHz or other suitable microwave frequency as permitted by the appropriate governing authority. One skilled in the art would recognize that the frequencies cited in this application make reference to a commonly used frequency as allowed by such authorities and that the invention is not limited by these frequencies. Also preferably the inductively-coupled plasma is produced with a power of between about 100 and 2000 W per wafer, more preferably about 500 W per wafer at the radio frequency range such as 13.56 MHz or other suitable radio frequency as permitted by the appropriate governing authority. One skilled in the art would recognize that the frequencies cited in this application make reference to a commonly used frequency as allowed by such authorities and that the invention is not limited by the referenced frequency. Inductively-coupled plasma is generated by applying RF power to a conductivity coil, plasma is ignited through the electromagnetic field generated inside the coils.

Preferably, the radio frequency generated plasma is an oxygen-based plasma. That is, oxygen is the only gas used to form the plasma. Methods of the invention are not limited to oxygen-based plasmas however. Preferably the radio frequency generated plasma is produced at a pressure of between about 200 and 1000 mTorr, more preferably about 400 mTorr. In one example, the oxygen-based plasma is produced at a radio frequency of about 13.56 MHz, for example, applied at a power of between about 200 and 600 Watts per wafer, more preferably about 420 Watts per wafer.

In one embodiment the process further includes applying microwave energy to the radio frequency generated plasma produced at (b). Preferably the microwave energy is, for example, at a frequency of about 2.45 GHz applied at a power of between about 0 and 2000 Watts per wafer.

Methods of the invention are low temperature methods. Preferably each of the microwave-generated plasma, inductively-coupled plasma, and the radio frequency generated plasma are applied to a wafer held at a temperature of between about 110° C. and 90° C., more preferably about 40° C.

These and other features and advantages of the present invention will be described in more detail below with reference to the associated drawings.

DETAILED DESCRIPTION OF THE PREFERRED EMBODIMENTS

Figure 1:
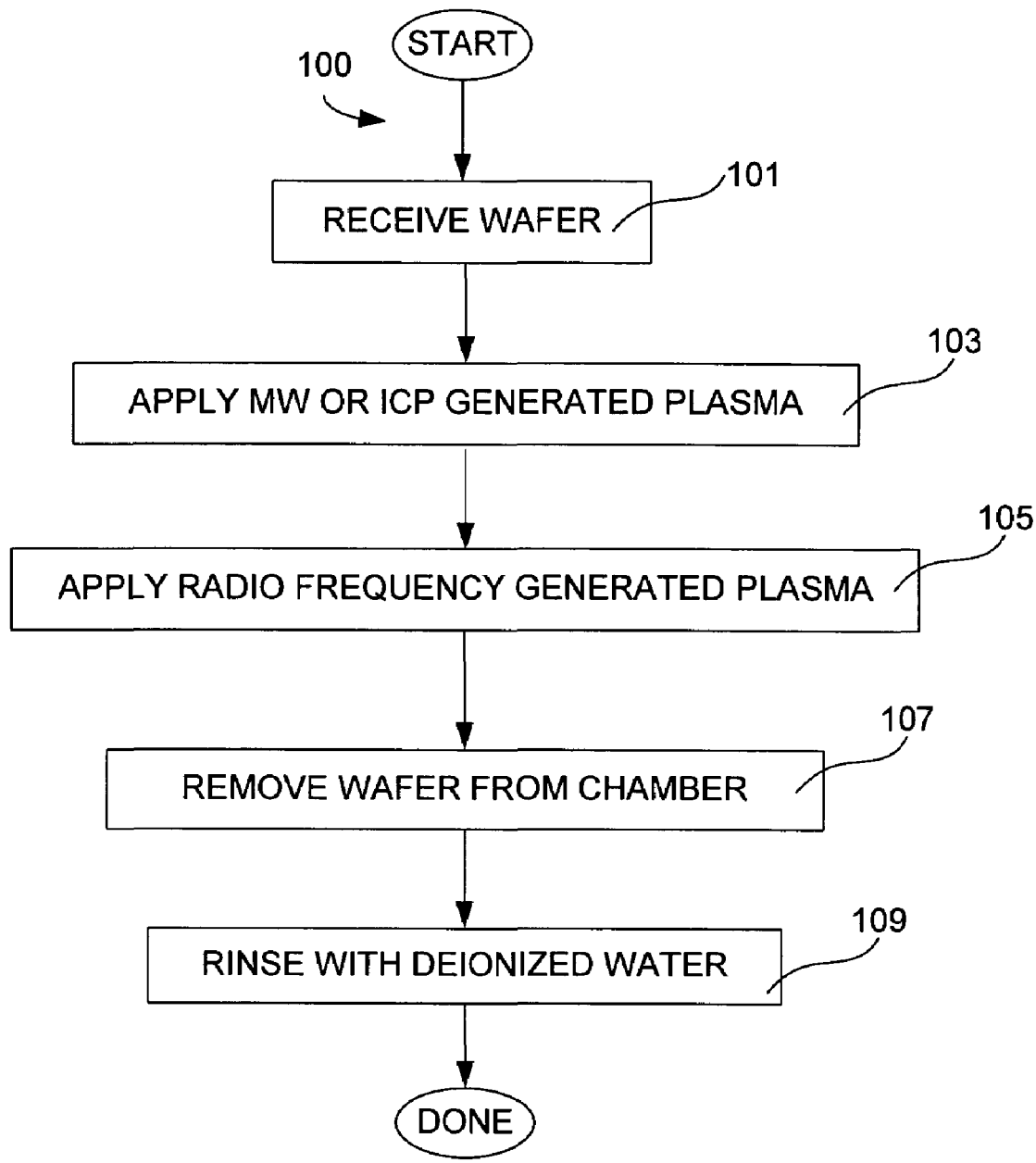
FIG. 1 is a flow chart showing aspects of a process flow in accordance with the invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. For example, specific methods described below reference removal of photoresist, etchant residues, and various polymeric materials left on a wafer after etching device features on a wafer using photoresist/lithography/etch techniques. However, the invention is not limited to cleaning these specific materials from a wafer. Additionally, the gas mixtures used to generate plasmas as described herein are provided for exemplary description of the invention. In some instances well-known processes, procedures, and components have not been described in detail so as not to unnecessarily obscure aspects of the present invention.

The following description identifies a semiconductor wafer as the work piece to be cleaned. The invention is not so limited. The work piece may be of various shapes, sizes, and materials. In addition to semiconductor wafers, other work pieces that may take advantage of this invention include various articles such as printed circuit boards, flat panel displays, and the like.

In this application, the term "wafer" will be used interchangeably with "wafer substrate", and "substrate." One skilled in the art would understand that these terms could refer to a silicon (semiconductor) wafer during any of many stages of integrated circuit fabrication thereon.

The current invention implements a reactive cleaning technique that is highly effective at cleaning the surface of a wafer, yet employs minimal physical sputter etching. As mentioned, a wafer is first treated by applying a microwave-generated plasma or an inductively-coupled plasma and then treated by applying radio frequency generated plasma. Process conditions for each plasma application dictate the removal rate and selectivity of the methods. In some examples, an RF bias may be applied to the microwave-generated plasma or the inductively-coupled plasma and/or microwave energy may be applied to the radio frequency generated plasma.

One apparatus that is particularly useful in performing methods of the invention is the PEP Iridia DL strip and clean system, available from Novellus Systems, of San Jose Calif. The PEP Iridia DL system includes a single processing chamber with both microwave and radio wave sources, each of which capable of producing plasmas from gas mixtures within the process chamber. In this example, the RF power is applied via a wafer holder or platen and the MW power is applied through the use of a magnetron wave-guide microwave applicator assembly. This provides microwave energy to an area where gases can be exposed to the microwaves before encountering the wafer surface to be treated. The microwave generator imparts no intrinsic directionality (i.e. isotropic conditions) to plasmas in the chamber. The radio wave generator can be used to induce plasma formation and impart directionality (i.e. anisotropic conditions) to plasmas within the chamber. Specifically, the more powerful the radio frequency applied to the wafer platen, the more directionality the plasma will have toward the wafer.

Another apparatus that is particularly useful in performing methods of the invention is the Gamma 2100 Asher, available from Novellus Systems, of San Jose Calif. The Gamma system includes a single processing chamber with both an inductively-coupled plasma remote plasma source and a radio wave source, each of which are capable of delivering plasmas within the process chamber. The Gamma tool is a batch system that can accommodate up to six wafers processed simultaneously in a single chamber. In this example, the RF power is applied via a wafer holder or platen and the inductively-coupled plasma is produced by another RF power source which provides power to a channel where gases are exposed to the RF power before encountering the wafer surface to be treated. The inductively-coupled plasma imparts no intrinsic directionality (i.e. isotropic conditions) to plasmas in the chamber. The radio wave generator (in the platen) can be used to induce plasma formation and impart directionality (i.e. anisotropic conditions) to plasmas within the chamber. Specifically, the more powerful the radio frequency applied to the wafer platen, the more directionality the plasma will have toward the wafer.

It is important to note that the parameters described for generation and application of plasmas of the invention to a wafer are influenced by the number of wafers to which the plasmas are applied. For example the Gamma tool is a batch system which can process six wafers at same time, and thus the gas flow and power are adjusted to levels proportionate to the number of wafers simultaneously processed in the chamber. The more wafers processed the more gas flow and plasma generation power are needed. One skilled in the art would understand that the invention parameters can be scaled appropriately to accommodate more than one wafer.

FIG. 1 is a flow chart depicting a process flow, 100, in accordance with the invention. Process flow 100 will be described in relation to an exemplary method of removing post-etch photoresist and polymer residue from a wafer in relation to FIGS. 2–8. Methods of the invention may have more or less process steps than those depicted in FIG. 1.

Figure 2:
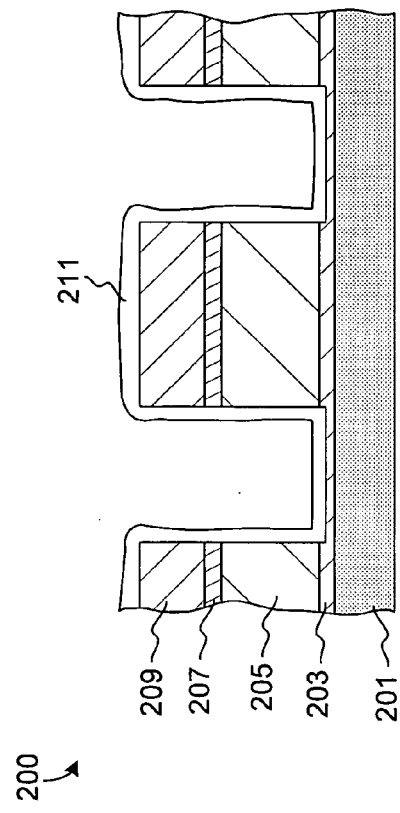
FIGS. 2–5 show example substrates in various stages of fabrication and cleaning in accordance with the invention.
Figure 3:
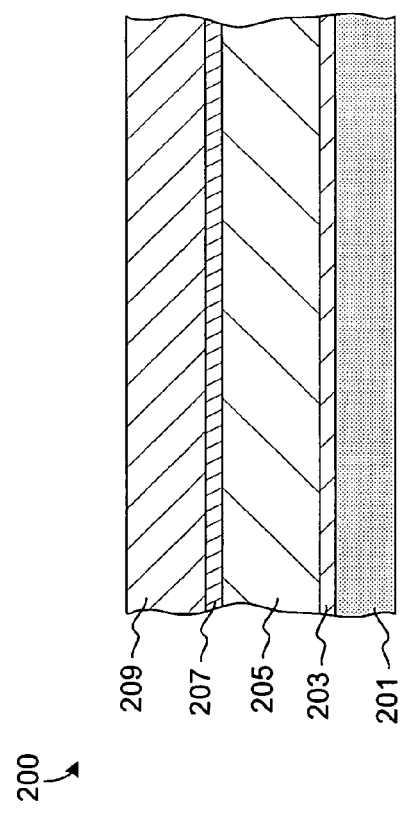

FIG. 2 depicts a cross section of a portion of a wafer substrate, 200, prior to lithography and photoresist etching. Wafer substrate 200 includes a silicon layer 201 (the wafer), a silicon (gate) oxide layer 203, a polysilicon layer 205, an etch stop layer 207, and a photoresist layer 209. During a typical IC fabrication process, photoresist layer 209 is patterned using lithography techniques and etched to form trench and via structures as depicted in FIG. 3. In addition to the vias depicted in FIG. 3, substrate 200 is coated with a polymer residue 211. Residue 211 results from the etching process to form the via structures, and therefore it may contain materials from any of the layers depicted in FIG. 1, as well as etchants used to form the vias. Residue 211 may or may not be conformal as depicted, depending on the process used to etch the device features. Substrate 200 as depicted in FIG. 3 is an exemplary substrate for methods of the invention. Typically gate oxide layer 203 is between about 15 and 100 Å thick, therefore minimal loss of this layer is desired to meet device performance requirements. The invention addresses this need.

Referring to process flow 100 of FIG. 1, first a wafer is received by the process chamber. See 101. Next, a microwave-generated plasma or an inductively-coupled plasma is applied to the wafer. See 103. Preferably each of the microwave-generated plasma and the inductively-coupled plasma includes an oxygen source gas, a fluorine source gas, a hydrogen source gas, and optionally a nitrogen source gas. Preferably the oxygen source gas includes at least one of $O_2$, $H_2O$, $O_3$, $CO_2$, $CO$, and $N_2O$. Preferably the flourine source gas includes at least one of $CF_4$, $NF_3$, $CHF_3$, $SF_6$, and $F_2$. Preferably the hydrogen source gas includes at least one of $H_2$, $H_2O$, and $NH_3$. Preferably the nitrogen source gas includes at least one of $N_2$, $N_2O$, and $NH_3$. Argon may also be used to produce plasmas of the invention.

As mentioned, conventional oxygen/fluorine-based plasmas can have uncontrollable and/or excessive removal rates with respect to device features and underlying layers, for example those made of many new low-k materials. While not wishing to be bound to theory, it is believed that in this invention, hydrogen species in the plasma (from the hydrogen source gas) consume at least part of the fluorine species in a reaction to generate HF vapor. This combination reduces the atomic fluorine that reaches the wafer surface and reduces base layer loss. Hydrogen is also believed to react with molecular oxygen species in the plasma, which also serves to reduce the photoresist strip rate from the plasma.

Preferably each of the inductively-coupled plasma and the microwave-generated plasma is formed at a pressure of between about 300 and 2000 mTorr, more preferably about 500 and 1000, and most preferably about 750 mTorr. Preferably the microwave-generated plasma is produced with a power of between about 200 and 3000 Watts per wafer, more preferably about 1300 Watts per wafer, at a frequency of about 2.45 GHz. Preferably the inductively-coupled plasma is produced with a power of between about 100 W and 2000 Watts per wafer, more preferably about 500 Watts per wafer, at a frequency of 13.6 MHz. Preferably the oxygen source gas includes between about 200 and 2000 SCCM of $O_2$ per wafer, more preferably about 1000 SCCM of $O_2$ per wafer. In one particularly preferred embodiment, the oxygen source gas includes between about 50 and 500 SCCM of $H_2O$ per wafer, more preferably about 100 SCCM of $H_2O$ per wafer. The nitrogen source gas preferably includes between about 50 and 1000 SCCM per wafer of a mixture of $N_2$ and $H_2$ (e.g. a "Forming Gas"), more preferably about 200 SCCM per wafer of a mixture of $N_2$ and $H_2$. Preferably the mixture of includes a ratio of $N_2$ to $H_2$ of between about 1:2 and 25:1. In a particularly preferred embodiment, a mixture of 96% $N_2$/4% $H_2$ is used as the nitrogen source gas and the hydrogen source gas.

Preferably the fluorine source gas comprises between about 5 and 100 SCCM per wafer of $CF_4$, more preferably about 60 SCCM per wafer of $CF_4$. Preferably each of the microwave-generated plasma and the inductively-coupled plasma are applied to a wafer held at a temperature of between about 10 and 90° C., more preferably about 40° C. Preferably each of the microwave-generated plasma and the inductively-coupled plasma have a hydrogen to fluorine ratio of between about 1:25 and 1:6. Preferably each of the microwave-generated plasma and the inductively-coupled plasma have a total flourine content of between about 0.5 and 20%.

Figure 4:
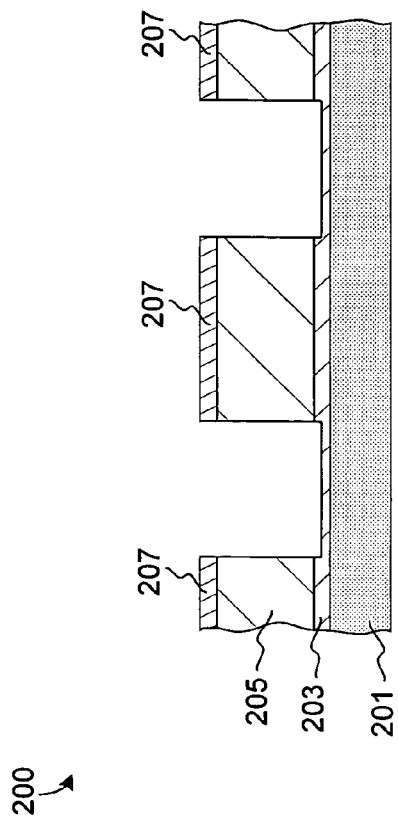

Under the above described conditions, the microwave-generated plasma or the inductively-coupled plasma is preferably applied to the wafer for between about 5 and 60 seconds, more preferably about 15 seconds. The result of such an application is depicted in FIG. 4. The first plasma step removes polymer layer 211 and a majority of photoresist layer 209. In some cases, depending on the material to be removed, an additional directionality may be added to the microwave-generated plasma or the inductively-coupled plasma by applying an RF bias. Preferably the RF bias is at a frequency of about 13.56 MHz applied at a power of between about 0 and 1000 Watts per wafer.

After either the microwave-generated plasma or the inductively-coupled plasma is applied, a radio frequency generated (preferably oxygen-based) plasma is applied to remove any remaining photoresist or residual particles (generally between about 0.5 and 1 $\mu$m in diameter) on the wafer. See box 105, FIG. 1. Preferably, the radio frequency generated plasma is produced at a pressure of between about 200 and 1000 mTorr, more preferably about 400 mTorr. As mentioned, preferably a radio frequency power source is provided to the wafer platen.

If oxygen-based, preferably the radio frequency generated plasma includes between about 200 and 1000 SCCM of $O_2$ per wafer, more preferably about 400 SCCM of $O_2$ per wafer. Preferably the oxygen-based plasma is produced at a radio frequency of about 13.56 MHz applied at a power of between about 200 and 600 Watts per wafer, more preferably at a power of about 420 Watts per wafer. Preferably the oxygen-based plasma is applied to a wafer held at a temperature of between about 10 and 90° C., more preferably about 40° C.

Figure 5:
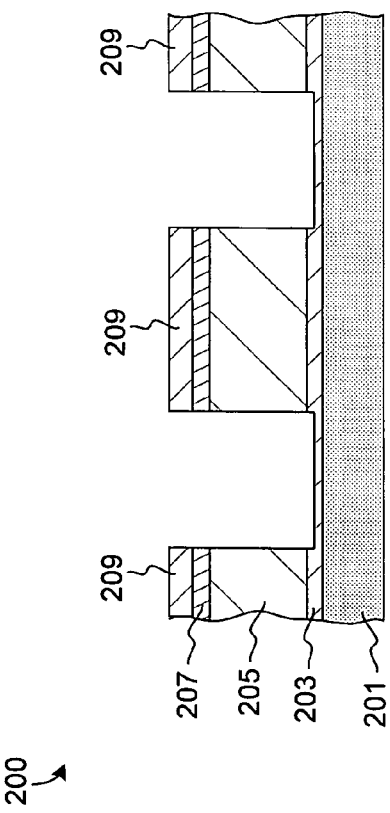

Under the above described conditions, the oxygen-based radio frequency generated plasma is applied for between about 10 and 90 seconds, more preferably about 70 seconds. The result of this application is depicted in FIG. 5. The radio frequency generated plasma removes the remainder of photoresist layer 209 with minimal loss (not shown) of gate oxide layer 203. Preferably less than 10 Å of gate oxide is removed. In some cases, depending on the material to be removed, a microwave energy may be applied to the radio frequency generated plasma. Preferably the microwave energy is applied at a frequency of about 2.45 GHz applied at a power of between about 0 and 3000 Watts per wafer.

Referring again to FIG. 1, after the radio frequency generated plasma is applied, the wafer is removed from the process chamber. Optionally, a deionized water rinse is performed to remove small amounts of water-soluble residues. See 109.

EXPERIMENTAL

Figure 7:
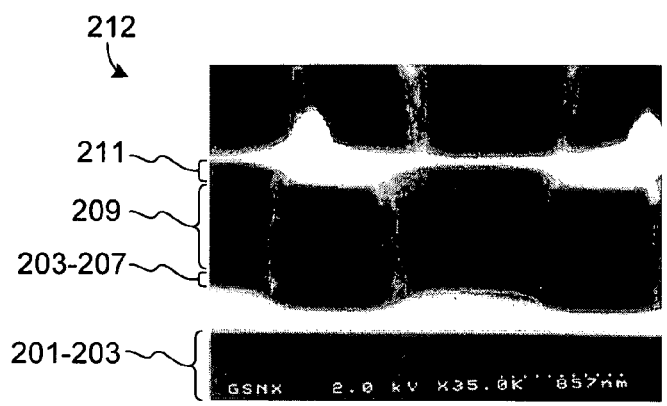
Figure 8:
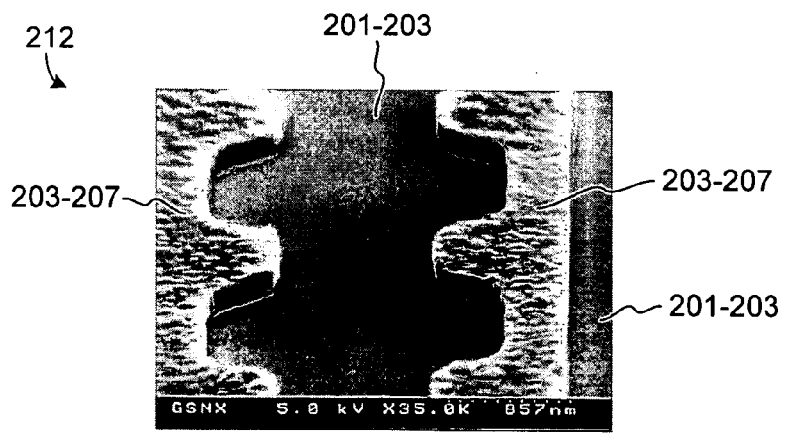

The table below depicts an exemplary two-step method of the invention. In this example a forming gas, 96% $N_2$/4% $H_2$ is used as the nitrogen source gas and the hydrogen source gas. No RF-bias is applied in step 1, and no microwave energy is applied in step 2. Both steps are carried out at 40° C. The method was shown to completely remove photoresist and polymer residue resulting from a reactive ion etch (RIE) as shown in FIGS. 6–8.

|  | STEP 1 | STEP 2 |
|---|---|---|
| Wafer support pin position (up or down) | down | down |
| Platen temperature (° C.) | 40° C. | 40° C. |
| $O_2$ (SCCM) | 1000 | 400 |
| Forming gas (SCCM) | 200 | 0 |
| $CF_4$ (SCCM) | 60 | 0 |
| Pressure (mTorr) | 750 | 400 |
| Microwave energy (Watts at 2.45 GHz) | 1300 | 0 |
| Radio wave energy (Watts at 13.56 MHz) | 0 | 420 |
| Step time (seconds) | 15 | 70 |

Figure 6:
FIGS. 6–8 are Scanning Electron Micrographs (SEM's) of actual substrates before and after application of cleaning methods of the invention.

FIG. 6 is an SEM photo of a wafer substrate, 212, before cleaning. FIG. 7, more clearly shows example silicon layer 201 (with a gate oxide layer 203), and a polysilicon layer 205 (resting on gate oxide layer 203 with an etch stop layer 207 on top), a photoresist layer 209, and a polymer residue layer 211. FIG. 8 shows substrate 212 after cleaning using the method with the parameters outlined in the table above. Polymer layer 211 and photoresist layer 209 are completely removed. The differences between the pre-plasma treatment and post-plasma treatment based on measurements from thin film measurement tools indicate that less than 10 Å of oxide layer 203 was removed.

Figure 9:
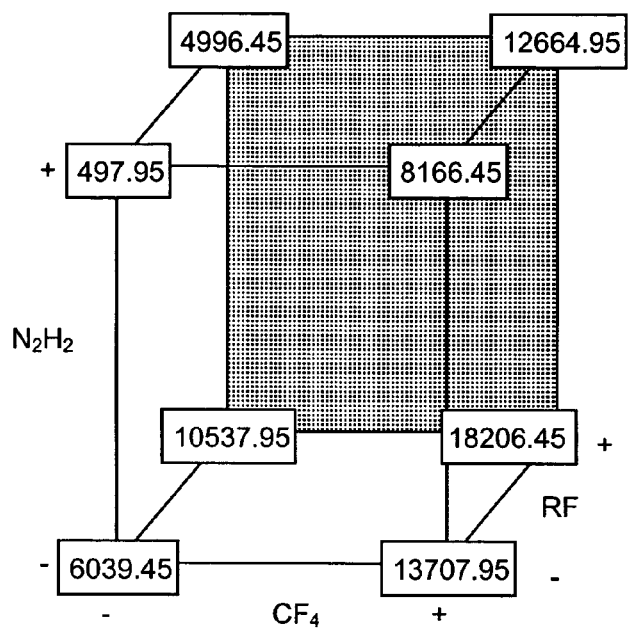
FIGS. 9–10 are cube diagrams showing process trends of photoresist strip rate and oxide etch rate, respectively.
Figure 10:
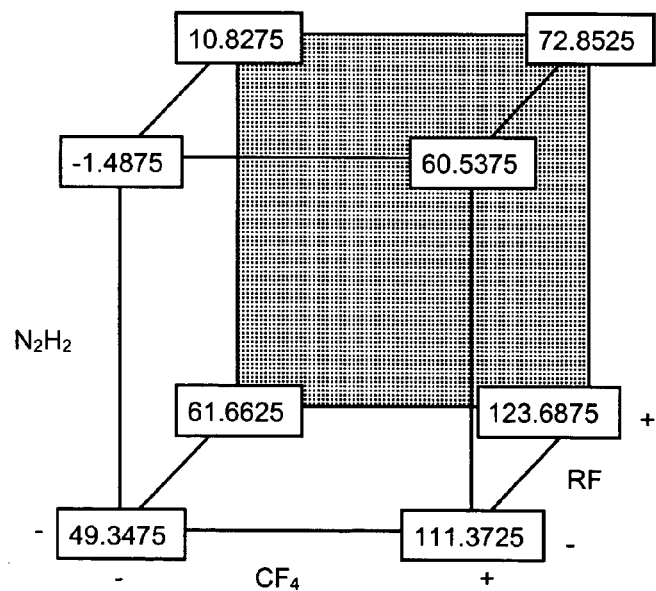

Using step 2 as outlined above, a photoresist removal rate of greater than 5500 Å per minute was achieved, while the oxide etch rate was less than 2 Å per minute. FIGS. 9 and 10 depict the step 1 process trends of the method outlined in the table above on photoresist strip rate and oxide etch rate, respectively. In this example, the photoresist strip rate and oxide etch rate have been determined as a function of forming gas ($N_2$ with 4% $H_2$) flow, $CF_4$ flow, and RF power. In the oxide rate process trend, low $CF_4$ and high forming gas flow shows almost zero oxide rate. Similarly, the photoresist strip rate is lower when forming gas is present in the $O_2$/$CF_4$ plasma as shown in the photorresist strip rate process trend. Most importantly, the addition of forming gas containing a hydrogen source, to generate the fluorine containing plasma shows dramatic improvements in controlling oxide etch rate, which in turns will reduce the oxide loss during photoresist and polymer removal process.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of cleaning organic material from a semiconductor wafer, the method comprising:
   (a) applying a microwave-generated plasma to the semiconductor wafer at a temperature of between 10 and 90° C. using a first plasma source at a first energy level; and then
   (b) applying a radio frequency generated plasma to the semiconductor wafer using a second plasma source, wherein the first plasma source is not energized during (b);
   wherein (a) and (b) are performed in a single process chamber.

2. The method of claim 1, wherein the microwave-generated plasma comprise an oxygen source gas, a fluorine source gas, and a hydrogen source gas.

3. The method of claim 2, wherein the microwave-generated plasma further comprise a nitrogen source gas.

4. The method of claim 3, wherein the nitrogen source gas comprises $N_2$, $N_2O$, and $NH_3$.

5. The method of claim 2, wherein the hydrogen source gas comprises at least one of $H_2$, $H_2O$, $NH_3$, and $H_2O_2$.

6. The method of claim 2, wherein the oxygen source gas comprises at least one of $O_2$, $H_2O$, $N_2O$, $CO$, $O_3$, $CO_2$.

7. The method of claim 2, wherein the fluorine source gas comprises at least one of $CF_4$, $NF_3$, $CHF_3$, $SF_6$, and $F_2$.

8. The method of claim 2, where the microwave-generated plasma is prodaced at a pressure of between about 300 and 2000 mTorr.

9. The method of claim 2, wherein the microwave-generated plasma is produced at a pressure of between about 500 and 1000 mTorr.

10. The method of claim 2, wherein the microwave-generated plasma is produced at a pressure of about 750 mTorr.

11. The method of claim 2, wherein the radio frequency generated plasma is produced with a power of between about 100 W and 2000 W per wafer, at a frequency of about 13.56 MHz.

12. The method of claim 2, wherein the radio frequency generated plasma is produced with a power of about 500 W per wafer, at a frequency of about 13.56 MHz.

13. The method of claim 2, wherein the microwave-generated plasma is produced with a power of between about 500 and 3000 Watts per wafer at a frequency of about 2.45 GHz.

14. The method of claim 2, wherein the microwave-generated plasma is produced with power of about 1300 Watts per wafer at a frequency of about 2.45 GHz.

15. The method of claim 6, wherein the oxygen source gas comprises between about 500 and 2000 SCCM of $O_2$ per wafer.

16. The method of claim 6, wherein the oxygen source gas comprises about 1000 SCCM of $O_2$ per wafer.

17. The method of claim 6, wherein the oxygen source gas comprises between about 50 and 500 SCCM of $H_2O$ per wafer.

18. The method of claim 6, wherein the oxygen source gas comprises about 100 SCCM of $H_2O$ per wafer.

19. The method of claim 3, wherein the nitrogen source gas comprises between about 50 and 500 SCCM per wafer of a mixture of $N_2$ and $H_2$.

20. The method of claim 3, wherein the nitrogen source gas comprises about 200 SCCM per wafer of a mixture of $N_2$ and $H_2$.

21. The method of claim 20, wherein the mixture comprises a ratio of $N_2$ to $H_2$ of between about 1:2 and 25:1.

22. The method of claim 20, wherein the mixture consists of 96% $N_2$/4% $H_2$.

23. The method of claim 7, wherein the fluorine source gas comprises between about 5 and 100 SCCM per wafer of $CF_4$.

24. The method of claim 7, wherein the fluorine source gas comprises about 60 SCCM per wafer of $CF_4$.

25. The method of claim 2, wherein the microwave-generated plasma is applied to a wafer held at a temperature of about 40° C.

26. The method of claim 2, wherein (a) is performed for between about 5 and 60 seconds.

27. The method of claim 2, wherein (a) is performed for about 15 seconds.

28. The method of claim 2, wherein (a) further comprises applying an RF bias to the microwave-generated plasma.

29. The method of claim 28, wherein the RF bias is at a frequency of about 13.56 MHz applied at a power of between just above about 0 and 1000 Watts per wafer.

30. The method of claim 2, wherein the radio frequency generated plasma is an oxygen-based plasma.

31. The method of claim 30, wherein the radio frequency generated plasma is produced at a pressure of between about 200 and 1000 mTorr.

32. The method of claim 30, wherein the radio frequency generated plasma is produced at a pressure of about 400 mTorr.

33. The method of claim 30, wherein the oxygen-based plasma comprises between about 200 and 1000 SCCM per wafer of $O_2$.

34. The method of claim 30, wherein the oxygen-based plasma comprises about 400 SCCM per wafer of $O_2$.

35. The method of claim 30, wherein the oxygen-based plasma is produced at a radio frequency of about 13.56 MHz applied at a power of between about 200 and 600 Watts per wafer.

36. The method of claim 30, wherein the oxygen-based plasma is produced at a radio frequency of about 13.56 MHz applied at a power of about 420 Watts per wafer.

37. The method of claim 30, wherein the oxygen-based plasma is applied to a wafer held at a temperature of between about 10 and 90° C.

38. The method of claim 30, wherein the oxygen-based plasma is applied to a wafer held at a temperature of about 40° C.

39. The method of claim 30, wherein (b) is performed for between about 30 and 90 seconds.

40. The method of claim 30, wherein (b) is performed for about 70 seconds.

41. The method of claim 30, wherein the microwave energy is applied at a frequency of about 2.45 GHz applied at power of between about 500 and 3000 Watts per wafer.

42. The method of claim 30, further comprising applying a deionized water rinse to the wafer after (a) and (b).

43. The method of claim 2, wherein the microwave-generated plasma comprises hydrogen to fluorine ratio of between about 1:25 and 1:6.

44. The method of claim 7, wherein the microwave-generated plasma comprises between about 0.5 and 25% total fluorine content.

45. The method of claim 2, wherein (a) further comprises applying a radio frequency generated plasma to the semiconductor wafer.

* * * * *